United States Patent
Yen et al.

(10) Patent No.: US 9,136,875 B2
(45) Date of Patent: Sep. 15, 2015

(54) DECODING METHOD, MEMORY STORAGE DEVICE AND REWRITABLE NON-VOLATILE MEMORY MODULE

(71) Applicant: PHISON ELECTRONICS CORP., Miaoli (TW)

(72) Inventors: Shao-Wei Yen, Kaohsiung (TW); Yu-Hsiang Lin, Yunlin County (TW); Wei Lin, Taipei (TW); Kuo-Hsin Lai, Hsinchu County (TW); Kuo-Yi Cheng, Taipei (TW)

(73) Assignee: PHISON ELECTRONICS CORP., Miaoli (TW)

( * ) Notice: Subject to any disclaimer, the term of this patent is extended or adjusted under 35 U.S.C. 154(b) by 86 days.

(21) Appl. No.: 14/054,848

(22) Filed: Oct. 16, 2013

(65) Prior Publication Data

US 2015/0067446 A1    Mar. 5, 2015

(30) Foreign Application Priority Data

Aug. 30, 2013  (TW) .............................. 102131273 A

(51) Int. Cl.
    G06F 11/10       (2006.01)
    H03M 13/11       (2006.01)

(52) U.S. Cl.
    CPC ........... *H03M 13/1105* (2013.01); *G06F 11/10* (2013.01)

(58) Field of Classification Search
    CPC ............... G06F 11/1072; G06F 11/10; H03M 13/1105; G11C 16/26; G11C 29/04

USPC ......................... 714/768, 763, 718, 785, 799; 365/185.03

See application file for complete search history.

(56) References Cited

U.S. PATENT DOCUMENTS

| | | | | |
|---|---|---|---|---|
| 8,876,099 | B2 * | 11/2014 | Guaraldi | 270/52.26 |
| 2007/0180346 | A1 * | 8/2007 | Murin | 714/755 |
| 2009/0070657 | A1 * | 3/2009 | Litsyn et al. | 714/773 |
| 2011/0096601 | A1 * | 4/2011 | Gavens et al. | 365/185.09 |
| 2011/0219284 | A1 * | 9/2011 | Uchikawa et al. | 714/763 |
| 2014/0355340 | A1 * | 12/2014 | Sharon et al. | 365/185.03 |
| 2015/0085573 | A1 * | 3/2015 | Sharon et al. | 365/185.03 |

* cited by examiner

*Primary Examiner* — Phung M Chung
(74) *Attorney, Agent, or Firm* — Jianq Chyun IP Office

(57) ABSTRACT

A decoding method, a memory storage device and a rewritable non-volatile memory module are provided. The method includes: reading a plurality of bits from the rewritable non-volatile memory module according to a reading voltage; performing a parity check of a low density parity check (LDPC) algorithm on the bits to obtain syndromes, and each of the bits is corresponding to at least one of the syndromes; determining whether the bits have an error according to the syndromes; if the bits have the error, obtaining a syndrome weight of each of the bits according to the syndromes corresponding to each of the bits; obtaining an initial value of each of the bits according to the syndrome weight of each of the bits; and performing a first iteration decoding of the LDPC algorithm on the bits according to the initial values. Accordingly, the decoding speed is increased.

24 Claims, 8 Drawing Sheets

DECODING METHOD, MEMORY STORAGE DEVICE AND REWRITABLE NON-VOLATILE MEMORY MODULE

CROSS-REFERENCE TO RELATED APPLICATION

This application claims the priority benefit of Taiwan application serial no. 102131273, filed on Aug. 30, 2013. The entirety of the above-mentioned patent application is hereby incorporated by reference herein and made a part of this specification.

BACKGROUND

1. Technology Field

The invention relates to a decoding method, and more particularly, to a decoding method regarding a low density parity check code, a memory storage device and a memory control circuit unit using the same.

2. Description of Related Art

The markets of digital cameras, cellular phones, and MP3 players have expanded rapidly in recent years, resulting in escalated demand for storage media by consumers. The characteristics of data non-volatility, low power consumption, and compact size make the rewritable non-volatile memory module (e.g., flash memory) ideal for being built in the portable multi-media devices as cited above.

Generally, a channel encoding is performed to data written in the rewritable non-volatile memory module. As a result, when the data are read from the rewritable non-volatile memory module, errors in the data may have a chance to be corrected. In case the channel encoding utilizes a low density parity check code, an iteration decoding is performed to the data read from the rewritable non-volatile memory module. The iteration decoding is configured to update reliability of one bit. A number of iterations required for the iteration decoding increases when there is more errors in the data. However, more iterations result in slower speed for decoding. Therefore, how to increase the speed for decoding is one of the major subjects for person skilled in the art.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The invention is directed to a decoding method, a memory storage device and a rewritable non-volatile memory module, capable of increasing speed for decoding.

A decoding method is provided according to an exemplary embodiment of the invention, which is used in a rewritable non-volatile memory module. The decoding method includes: reading a plurality of bits from the rewritable non-volatile memory module according to a first reading voltage; performing a parity check of a low density parity check algorithm on the bits to obtain a plurality of syndromes, wherein each of the bits is corresponding to at least one of the syndromes; determining whether the bits have at least one first error according to the syndromes; if the bits have the first error, obtaining a syndrome weight of each of the bits according to the syndromes corresponding to each of the bits; obtaining a first initial value of each of the bits according to the syndrome weight of each of the bits; and performing a first iteration decoding of the low density parity check algorithm on the bits according to the first initial values.

A memory storage device is provided according to an exemplary embodiment of the invention, which includes a connection interface unit, a rewritable non-volatile memory module and a memory control circuit unit. The connection interface unit is configured to couple to a host system. The memory control circuit unit is coupled to the connection interface unit and the rewritable non-volatile memory module, and configured to read a plurality of bits from the rewritable non-volatile memory module according to a first reading voltage. The memory control circuit unit is also configured to perform a parity check of a low density parity check algorithm on the bits to obtain a plurality of syndromes, and each of the bits is corresponding to at least one of the syndromes. The memory control circuit unit is also configured to determine whether the bits have at least one first error according to the syndromes. If the bits have the at least one first error, the memory control circuit unit is configured to obtain a syndrome weight of each of the bits according to the syndromes corresponding to each of the bits. The memory control circuit unit is also configured to obtain a first initial value of each of the bits according to the syndrome weight of each of the bits. The memory control circuit unit is also configured to perform a first iteration decoding of the low density parity check algorithm on the bits according to the first initial values.

A rewritable non-volatile memory module is provided according to an exemplary embodiment of the invention, which includes a memory cell array and a control circuit. The control circuit is coupled to the memory cell array and configured to read a plurality of bits from the memory cell array according to a first reading voltage, and perform a parity check of a low density parity check algorithm on the bits to obtain a plurality of syndromes. Each of the bits corresponds to at least one of the syndromes. The control circuit is also configured to determine whether the bits have at least one first error according to the syndromes. If the bits have the at least one first error, the control circuit is configured to obtain a syndrome weight of each of the bits according to the syndromes corresponding to each of the bits, obtain a first initial value of each of the bits according to the syndrome weight of each of the bit, and perform a first iteration decoding of the low density parity check algorithm on the bits according to the first initial values.

Based on above, the decoding method, the memory storage device and the rewritable non-volatile memory module provided in the exemplary embodiment of the invention are capable of obtaining different initial value based on different syndrome weights. As a result, the number of iterations for iteration decoding is decreased so that a speed of the decoding is increased.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
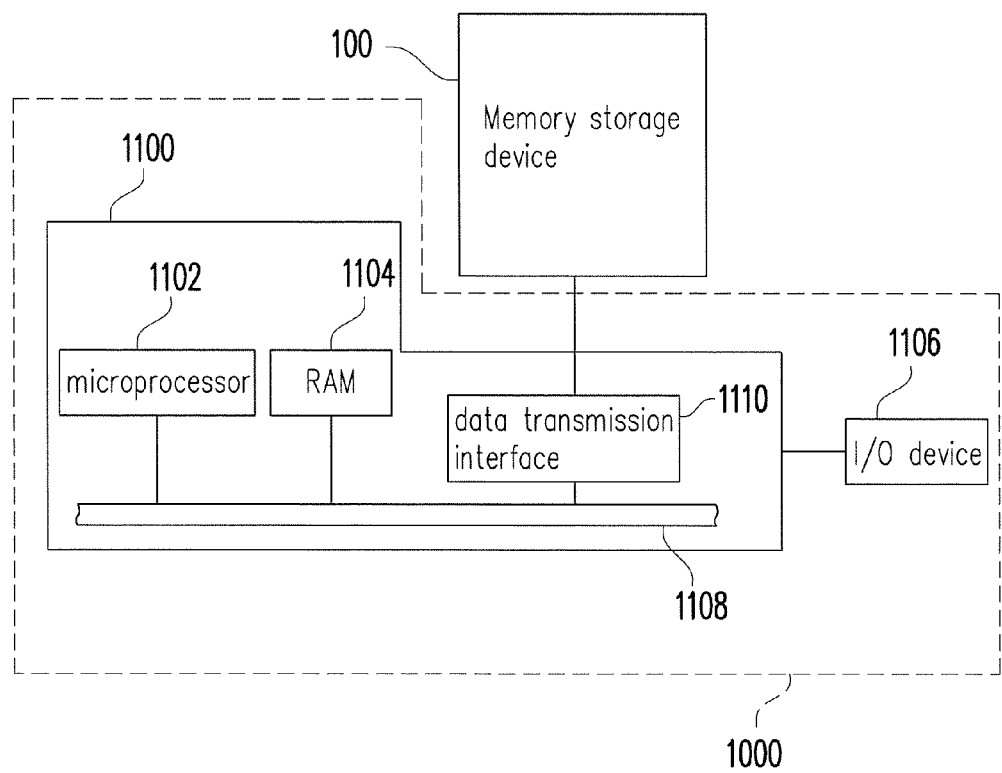
FIG. 1A illustrates a host system and a memory storage device according to an exemplary embodiment.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, a memory storage device (also known as a memory storage system) includes a rewritable non-volatile memory module and a controller (also known as a control circuit). The memory storage device is usually configured together with a host system so that the host system may write data to or read data from the memory storage device.

FIG. 1A illustrates a host system and a memory storage device according to an exemplary embodiment.

Figure 1B:
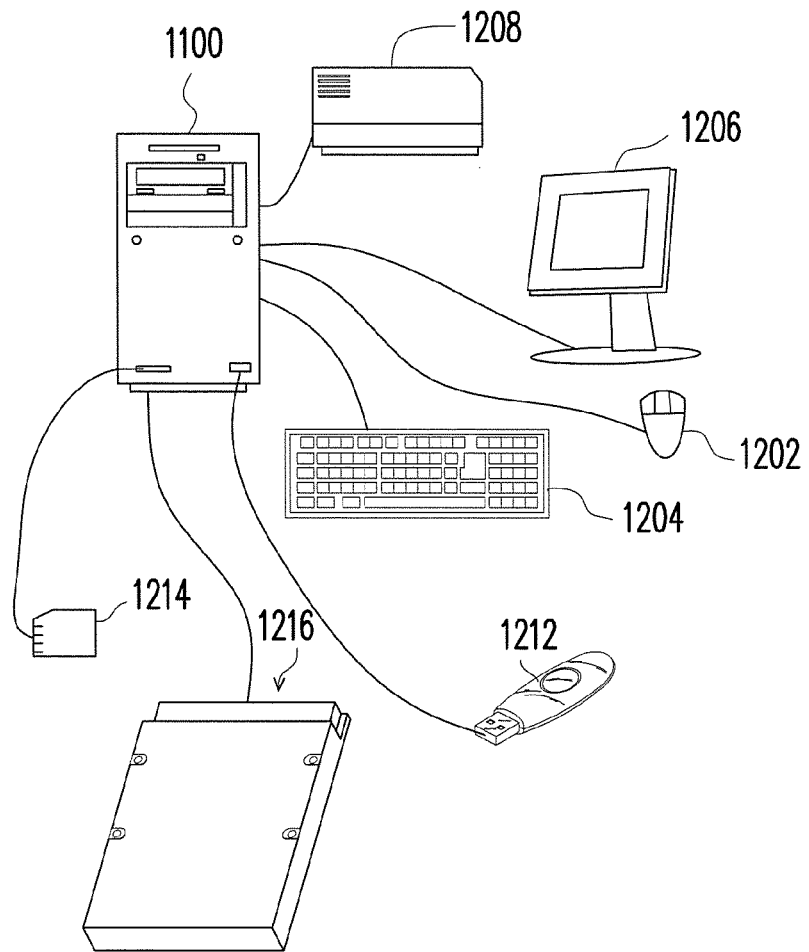
FIG. 1B is a schematic diagram illustrating a computer, an input/output device and a memory storage device according to an exemplary embodiment.

Referring to FIG. 1A, a host system 1000 includes a computer 1100 and an input/output (I/O) device 1106. The computer 1100 includes a microprocessor 1102, a random access memory (RAM) 1104, a system bus 1108, and a data transmission interface 1110. The I/O device 1106 includes a mouse 1202, a keyboard 1204, a display 1206 and a printer 1208 as shown in FIG. 1B. It should be understood that the devices illustrated in FIG. 1B are not intended to limit the I/O device 1106, and the I/O device 1106 may further include other devices.

In the embodiment of the invention, the memory storage device 100 is coupled to the devices of the host system 1000 through the data transmission interface 1110. By using the microprocessor 1102, the random access memory (RAM) 1104 and the Input/Output (I/O) device 1106, data may be written to the memory storage device 100 or may be read from the memory storage device 100. For example, the memory storage device 100 may be a rewritable non-volatile memory storage device such as a flash drive 1212, a memory card 1214, or a solid state drive (SSD) 1216 as shown in FIG. 1B.

Figure 1C:
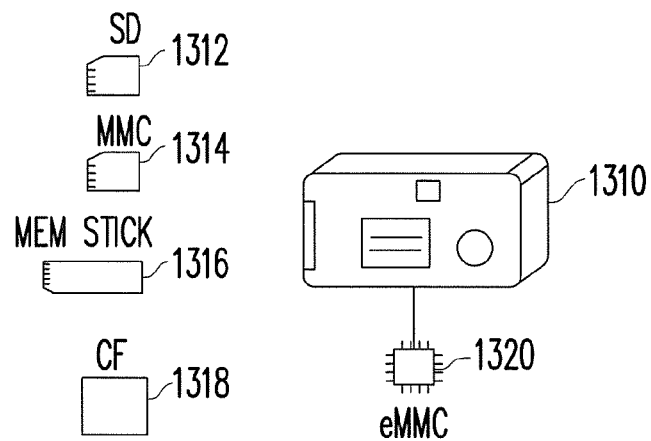
FIG. 1C is a schematic diagram illustrating a host system and a memory storage device according to an exemplary embodiment.

Generally, the host system 1000 may substantially be any system capable of storing data with the memory storage device 100. Although the host system 1000 is described as a computer system in the present exemplary embodiment, in another exemplary embodiment of the invention, the host system 1000 may be a digital camera, a video camera, a telecommunication device, an audio player, or a video player. For example, if the host system is a digital camera (video camera) 1310, the rewritable non-volatile memory storage device may be a SD card 1312, a MMC card 1314, a memory stick 1316, a CF card 1318 or an embedded storage device 1320 (as shown in FIG. 1C). The embedded storage device 1320 includes an embedded MMC (eMMC). It should be mentioned that the eMMC is directly coupled to a substrate of the host system.

Figure 2:
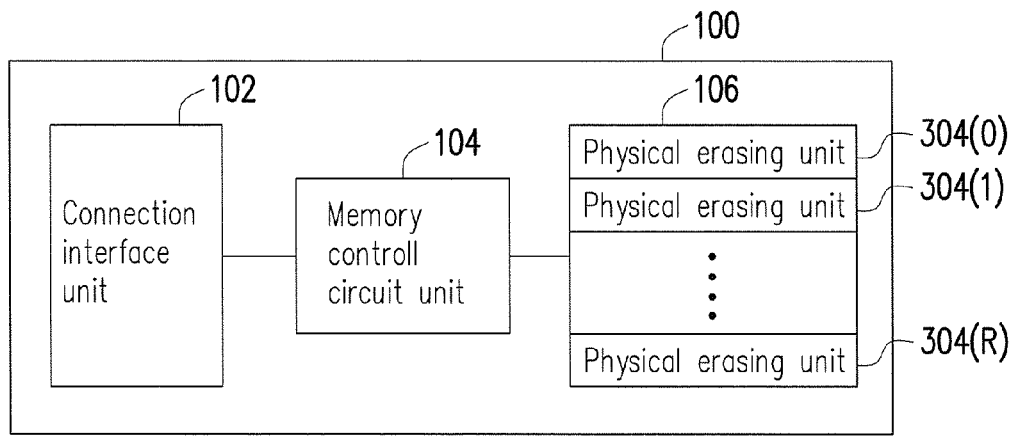
FIG. 2 is a schematic block diagram illustrating the memory storage device depicted in FIG. 1A.

FIG. 2 is a schematic block diagram illustrating the memory storage device depicted in FIG. 1A.

Referring to FIG. 2, the memory storage device 100 includes a connection interface unit 102, a memory control circuit unit 104 and a rewritable non-volatile memory storage module 106.

In the present exemplary embodiment, the connection interface unit 102 is compatible with a serial advanced technology attachment (SATA) standard. However, the invention is not limited thereto, and the connection interface unit 102 may also be compatible with a Parallel Advanced Technology Attachment (PATA) standard, an Institute of Electrical and Electronic Engineers (IEEE) 1394 standard, a peripheral component interconnect (PCI) Express interface standard, a universal serial bus (USB) standard, a secure digital (SD) interface standard, a Ultra High Speed-I (UHS-I) interface standard, a Ultra High Speed-II (UHS-II) interface standard, a memory stick (MS) interface standard, a multi media card (MMC) interface standard, an embedded MMC (eMMC) interface standard, a Universal Flash Storage (UFS) interface standard, a compact flash (CF) interface standard, an integrated device electronics (IDE) interface standard or other suitable standards. The connection interface unit 102 and the memory control circuit unit 104 can be packaged into one chip, or the connection interface unit 102 is distributed outside of a chip containing the memory control circuit unit 104.

The memory control circuit unit 104 is configured to execute a plurality of logic gates or control commands which are implemented in a hardware form or in a firmware form, so as to perform operations of writing, reading or erasing data in the rewritable non-volatile memory storage module 106 according to the commands of the host system 1000.

The rewritable non-volatile memory storage module 106 is coupled to the memory control circuit unit 104 and configured to store data written from the host system 1000. The rewritable non-volatile memory storage module 106 has multiple physical erasing units 304(0) to 304(R). For example, the physical erasing units 304(0) to 304(R) may belong to the same memory die or belong to different memory dies. Each physical erasing unit has a plurality of physical programming units, and the physical programming units of the same physical erasing unit may be written separately and erased simultaneously. For example, each physical erasing unit is composed by 128 physical programming units. Nevertheless, it should be understood that the invention is not limited thereto. Each physical erasing unit is composed by 64 physical programming units, 256 physical programming units or any amount of the physical programming units.

More specifically, each of the physical programming units includes a plurality of word lines and a plurality of bit lines, and a memory cell is disposed at an intersection of each of the word lines and each of the data lines. Each memory cell can store one or more bits. All of the memory cells in the same physical erasing unit are erased together. In the present exemplary embodiment, the physical erasing unit is a minimum unit for erasing. Namely, each physical erasing unit contains the least number of memory cells to be erased together. For instance, the physical erasing unit is a physical block. Furthermore, the memory cells on the same word line can be grouped into one or more of the physical programming units. In case each of the memory cells can store more than two bits, the physical programming units on the same word line can be classified into a lower physical programming unit and an upper physical programming unit. Generally, a writing speed of the lower physical programming unit is faster than a writing speed of the upper physical programming unit. In the present exemplary embodiment, the physical programming unit is a minimum unit for programming. That is, the physical programming unit is the minimum unit for writing data. For example, the physical programming unit is a physical page or a physical sector. In case the physical programming unit is the physical page, each physical programming unit usually includes a data bit area and a redundancy bit area. The data bit area has multiple physical sectors configured to store user data, and the redundant bit area is configured to store system data (e.g., error correcting code). In the present exemplary embodiment, each of the data bit areas contains 32 physical sectors, and a size of each physical sector is 512-byte (B). However, in other exemplary embodiments, the data bit area may also include 8, 16, or more or less of the physical sectors, and amount and sizes of the physical sectors are not limited in the invention.

In the present exemplary embodiment, the rewritable non-volatile memory module 106 is a Single Level Cell (SLC) NAND flash memory module in which one memory cell is capable of storing one bit. However, the invention is not limited thereto. The rewritable non-volatile memory module 106 may also be a Multi Level Cell (MLC) NAND flash memory module, a Trinary Level Cell (TLC) NAND flash memory module, other flash memory modules or any memory module having the same features.

Figure 3:
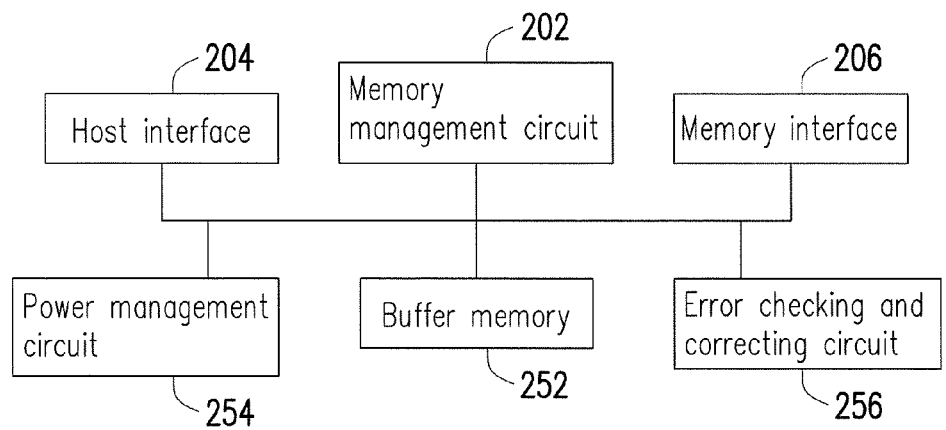
FIG. 3 is a schematic block diagram illustrating a memory control circuit unit according to an exemplary embodiment.

FIG. 3 is a schematic block diagram illustrating a memory control circuit unit according to an exemplary embodiment.

Referring to FIG. 3, the memory control circuit unit 104 includes a memory management circuit 202, a host interface 204 and a memory interface 206.

The memory management circuit 202 is configured to control overall operations of the memory control circuit unit 104. Specifically, the memory management circuit 202 has a plurality of control commands. When the memory storage device 100 operates, the control commands are executed to perform various operations such as data writing, data reading and data erasing. Operations of the memory management circuit 202 are similar to the operations of the memory control circuit unit 104, thus related description is omitted hereinafter.

In the present exemplary embodiment, the control commands of the memory management circuit 202 are implemented in a form of a firmware. For example, the memory management circuit 202 has a microprocessor unit (not illustrated) and a ROM (not illustrated), and the control commands are burned into the ROM. When the memory storage device 100 is operated, the control commands are executed by the microprocessor to perform operations of writing, reading or erasing data.

In another exemplary embodiment of the invention, the control commands of the memory management circuit 202 may also be stored as program codes in a specific area (for example, the system area in a memory exclusively used for storing system data) of the rewritable non-volatile memory module 106. In addition, the memory management circuit 202 has a microprocessor unit (not illustrated), a ROM (not illustrated) and a RAM (not illustrated). More particularly, the ROM has a boot code, which is executed by the microprocessor unit to load the control commands stored in the rewritable non-volatile memory module 106 to the RAM of the memory management circuit 202 when the memory control circuit unit 104 is enabled. Next, the control commands are executed by the microprocessor unit to perform operations of writing, reading or erasing data.

Further, in another exemplary embodiment of the invention, the control commands of the memory management circuit 202 may also be implemented in a form of hardware. For example, the memory management circuit 220 includes a microcontroller, a memory writing unit, a memory reading unit, a memory erasing unit and a data processing unit. The memory management unit, the memory writing unit, the memory reading unit, the memory erasing unit and the data processing unit are coupled to the microprocessor. The memory management unit is configured to manage the physical erasing units of the rewritable non-volatile memory module 106; the memory writing unit is configured to issue a write command to the rewritable non-volatile memory module 106 in order to write data to the rewritable non-volatile memory module; the memory reading unit is configured to issue a read command to the rewritable non-volatile memory module 106 in order to read data from the rewritable non-volatile memory module 106; the memory erasing unit is configured to issue an erase command to the rewritable non-volatile memory module 106 in order to erase data from the rewritable non-volatile memory module 106; the data processing unit is configured to process both the data to be written to the rewritable non-volatile memory module 106 and the data to be read from the rewritable non-volatile memory module 106.

The host interface 204 is coupled to the memory management circuit 202 and configured to receive and identify commands and data sent from the host system 1000. Namely, the commands and data sent from the host system 1000 are passed to the memory management circuit 202 through the host interface 204. In the present exemplary embodiment, the host interface 204 is compatible to a SATA standard. However, it should be understood that the present invention is not limited thereto, and the host interface 204 may also be compatible with a PATA standard, an IEEE 1394 standard, a PCI Express standard, a USB standard, a SD standard, a UHS-I standard, a UHS-II standard, a MS standard, a MMC standard, a eMMC standard, a UFS standard, a CF standard, an IDE standard, or other suitable standards for data transmission.

The memory interface 206 is coupled to the memory management circuit 202 and configured to access the rewritable non-volatile memory module 106. That is, data to be written to the rewritable non-volatile memory module 106 is converted to a format acceptable to the rewritable non-volatile memory module 106 through the memory interface 206.

In an exemplary embodiment of the invention, the memory control circuit unit 104 further includes a buffer memory 252, a power management circuit 254 and an error checking and correcting circuit 256.

The buffer memory 252 is coupled to the memory management circuit 202 and configured to temporarily store data and commands from the host system 1000 or data from the rewritable non-volatile memory module 106.

The power management unit 254 is coupled to the memory management circuit 202 and configured to control the power of the memory storage device 100.

The error checking and correcting circuit 256 is coupled to the memory management circuit 202 and configured for performing an error checking and correcting process to ensure the correctness of data. Specifically, when the memory management circuit 202 receives a write command from the host system 1000, the error checking and correcting circuit 256 generates an error correcting code (ECC) for data corresponding to the write command, and the memory management circuit 202 writes data and the ECC corresponding to the write command to the rewritable non-volatile memory module 106. Subsequently, when the memory management circuit 202 reads the data from the rewritable non-volatile memory module 106, the corresponding ECC is also read from the rewritable non-volatile memory module 106 simultaneously, and the error checking and correcting circuit 256 executes the error checking and correcting procedure for the read data based on the ECC.

Figure 4:
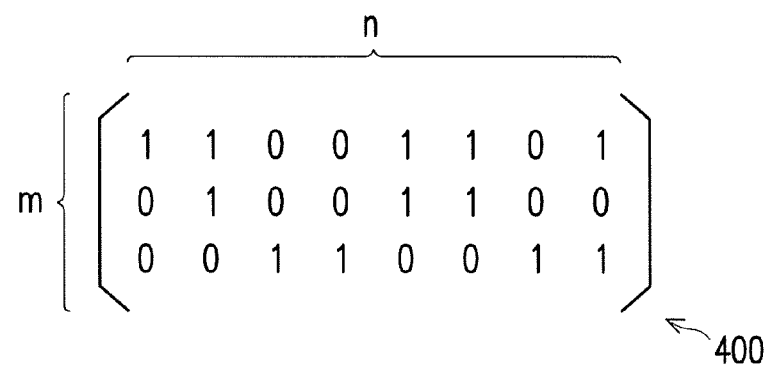
FIG. 4 is a schematic diagram illustrating a parity check matrix according to an exemplary embodiment.

In the present exemplary embodiment, the error correcting code used by the error checking and correcting circuit 256 is a low density parity check (LDPC) code. In other words, the error checking and correcting circuit 256 encodes and decodes according to a low density parity check algorithm. The error checking and correcting circuit 256 sets a parity check matrix with a dimension being "m-by-n". Therein, m and n are positive integers. The positive integers n indicate a number of bits in one codeword, and the positive integer m indicates a number of parity check bit in one codeword. Accordingly, a difference obtained from subtracting the positive integer m from the positive integer n (n−m) indicates a number of information bits (also referred as message bits) in one codeword. FIG. 4 is a schematic diagram illustrating a parity check matrix according to an exemplary embodiment. Referring to FIG. 4, a parity check matrix 400 has a dimension being 3-by-8. Generally, the positive integers m and n are greater than 3 and 8. FIG. 4 is merely an example of the invention, and values of the positive integers m and n are not particularly limited. Each row in the parity check matrix 400 also represents a constraint. Take first row as an example, when one codeword is a valid codeword, a bit "0" is obtained after performing a modulo-2 addition to first, second, fifth, sixth, and eighth bits in the codeword. Persons skilled in the art should be able to understand how to encode by using the parity check matrix 400, thus related description is omitted hereinafter.

Figure 5:
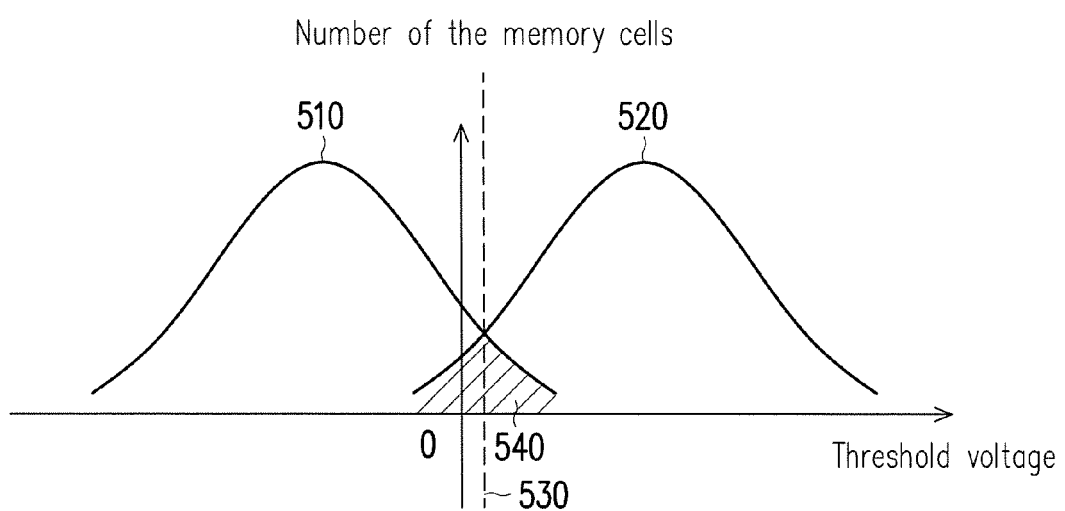
FIG. 5 is a schematic diagram illustrating an example of reading the rewritable non-volatile memory module according to a reading voltage according to an exemplary embodiment.

When the memory management circuit 202 intends to write a plurality of bits to the rewritable non-volatile memory module 106, the error checking and correcting circuit 256 correspondingly generates m parity check bits for every (n−m) bits to be written. Subsequently, the memory management circuit 202 writes n bits to the rewritable non-volatile memory module 106. The rewritable non-volatile memory module 106 stores one bit by changing a threshold voltage of one memory cell. FIG. 5 is a schematic diagram illustrating an example of reading the rewritable non-volatile memory module according to a reading voltage according to an exemplary embodiment. Referring to FIG. 5, a horizontal axis represents the threshold voltage of the memory cells, and a vertical axis represents a number of the memory cells. For instance, FIG. 5 illustrates the threshold voltage of each memory cell in one specific physical programming unit. It is assumed that, when the threshold voltage of the specific memory cell falls in a distribution 510, the bit stored in the memory cell is "1". Otherwise, when the threshold voltage of the specific memory cell falls in a distribution 520, the bit stored in the memory cell is "0". In the present exemplary embodiment, the threshold voltage includes two possible distributions. However, in other exemplary embodiments, the threshold voltage can include four, eight or any number of distributions, and a reading voltage 530 can fall between any two distributions. In addition, the bit representing each distribution is not particularly limited in the invention (e.g., it can be bits "00", "01" or other bits).

When intending to read the data from the rewritable non-volatile memory module 106, the memory management circuit 202 first reads the bits from the corresponding physical programming unit by using the reading voltage 530 (also known as a first reading voltage). In case the threshold voltage of a memory cell is less than the reading voltage 530, the memory cell is then turned on, and the bit "1" is read by the memory management circuit 202. Otherwise, in case the threshold voltage of the specific memory cell is greater than the reading voltage 530, the memory cell is not turned on, and the bit "0" is read by the memory management circuit 202. It should be noted that, the distribution 510 and the distribution 520 include an overlapping region 540 which represents that some of the memory cells are stored with the bit "1" (which belongs to the distribution 510) while having the threshold voltages being greater than the reading voltage 530; or, some of the memory cells are stored with the bit "0" (which belongs to the distribution 520) while having the threshold voltages being less than the reading voltage 530. In other words, a part of bits among all the bits being read may have errors.

After the memory management circuit 202 reads the bits from the rewritable non-volatile memory module 106 according to the reading voltage 530, the bits are divided into one or more codewords having a length being n. The error checking and correcting circuit 256 can decode each of the codewords. More specifically, the error checking and correcting circuit 256 first performs a parity check of the low density parity check algorithm on the bits in a codeword to obtain a plurality of syndromes. For instance, the error checking and correcting circuit 256 can perform a modulo-2 matrix multiplication to the parity check matrix and one codeword, which can be represented by the following equation (1).

$$[H][V]=[S] \qquad (1)$$

Figure 6:
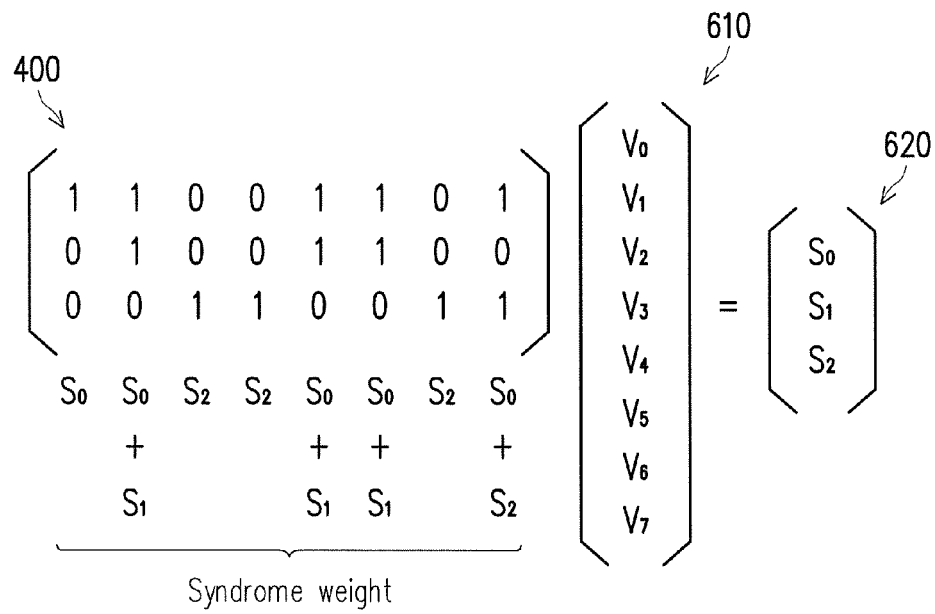
FIG. 6 is a schematic diagram illustrating a matrix multiplication according to an exemplary embodiment.

H is the parity check matrix. V is one codeword with the dimension being n-by-1. S is a syndrome vector including the syndromes, and a dimension of the syndrome vector is m-by-1. The error checking and correcting circuit 256 determines if the bits in the codeword V have error (also known as a first error) according to the syndromes. More specifically, in case each of the syndromes in the syndrome vector S is the bit "0", this indicates that the codeword V has no error. In case one of the syndromes in the syndrome vector S is the bit "1", this indicates that the codeword V has at least one error. FIG. 6 is a schematic diagram illustrating a matrix multiplication according to an exemplary embodiment. Take FIG. 6 as an example, a result of multiplying the parity check matrix 400 by a codeword 610 is a syndrome vector 620. Each of the bits in the codeword 610 corresponds to at least one syndrome in the syndrome vector 620. For instance, a first bit $V_0$ (which corresponds to first row of the parity check matrix 400) in the codeword 610 corresponds to a syndrome $S_0$; and a bit $V_1$ (which corresponds to second row of the matrix) corresponds to a syndrome $S_0$ and a syndrome $S_1$. When error occurs in the bit $V_0$, the syndrome $S_0$ may be the bit "1". When error occurs in the bit $V_1$, the syndrome $S_0$ and $S_1$ may be the bit "1". In other words, in case an element at an i-th row and a j-th column in the parity check matrix 400 is "1", a j-th bit in the codeword 10 corresponds to an i-th syndrome in the syndrome vector 620, and i and j are positive integers.

In case the codeword 610 has no error, the error checking and correcting circuit 256 can output the bits in the codeword 610. In case the codeword 610 has error, the error checking and correcting circuit 256 can perform a dynamic information scaling (DIS) algorithm. With the dynamic information scaling algorithm, the error checking and correcting circuits 256 sets an initial value for each of the bits $V_0$ to $V_7$ according to the syndromes $S_0$ to $S_2$. The initial values are used to perform the iteration decoding of the low density parity check algorithm. Generally, the syndromes $S_0$ to $S_2$ are used to predict a possibility for error to occur in each of the bits. Based on the possibilities, the initial values of the bits are scaled into different magnitudes. Steps in the dynamic information scaling algorithm are described in detail as follows.

First, the error checking and correcting circuit 256 obtains a syndrome weight of each of the bits according to the syndromes corresponding to each of the bits. For instance, the error checking and correcting circuit 256 obtains the syndrome weight by adding the syndromes corresponding to each of the bits together. As shown in FIG. 6, the syndrome weight of the bit $V_0$ is equal to the syndrome $S_0$; the syndrome weight of the bit $V_1$ is equal to a sum of the syndrome $S_0$ and syndrome $S_1$, the rest may be deduced by analogy. It should be noted that, the addition for the syndromes $S_0$ to $S_2$ is a normal addition instead of the modulo-2 addition. However, in another exemplary embodiment, the error checking and correcting circuit 256 may multiply each of the syndromes by a weight, and the syndrome weight can be obtained by accumulating results of the syndromes multiplied by the weights. For instance, the syndrome weight of the bit $V_1$ is equal to $W_0S_0+W_1S_1$, and the weights $W_0$ and $W_1$ are real numbers. The error checking and correcting circuit 256 may decide the weights according to a number of the bits corresponding to the syndromes. For instance, the syndrome $S_0$ corresponds to 5 bits, and the syndrome $S_1$ corresponds to 3 bits. Accordingly, the error checking and correcting circuit 256 may set the weight $W_0$ as to be less than (or greater than) the weight $W_1$. Methods for setting the weight of each of the syndromes are not particularly limited in the invention. In another exemplary embodiment, the error checking and correcting circuit 256 may use at least one of the syndromes $S_0$ to $S_2$ as an input of a function, and uses the output of the function as the syndrome weight. The function can be a linear function, a polynomial function, an exponential function or other non-linear functions, and the invention is not limited to the above.

After the syndrome weight of each of the bits is obtained, the error checking and correcting circuit 256 obtains an initial value (also known as a first initial value) of each of the bits in the codeword 610 according to the syndrome weights, and perform a first iteration decoding of the low density parity check algorithm on the bits $V_0$ to $V_7$. In the present exemplary embodiment, the first iteration decoding is also known as a hard bit mode decoding. However, in another exemplary embodiment, the first iteration decoding can also be of a soft bit mode decoding, namely, the memory management circuit 202 may obtain the codeword 610 and a reading information according to a plurality of reading voltages. The syndrome weight is configured to represent a degree of the possibility for error to occur in each of the bits. When the syndrome weight is greater, the possibility for error to occur in the corresponding bit is higher. Accordingly, the error checking and correcting circuit 256 can set different initial values based on different syndrome weights. In the present exemplary embodiment, when the codeword 610 is read, the bits $V_0$ to $V_7$ can only be of the two possible bits (i.e., the bit "0" and the bit "1"). However, after the initial value is obtained according to the syndrome weights, at least three bits among the bits $V_0$ to $V_7$ have different initial values. In other words, a number of information for performing the first iteration decoding is increased so that the number of iterations in the first iteration decoding is reduced.

For instance, a plurality of intervals (also known as a first intervals) are set by the error checking and correcting circuit 256, and each of the first internal is set to correspond to one error scaling (also know as a first error scaling). The error checking and correcting circuit 256 determines the first intervals in which the syndrome weight of each of the bits is located to obtain the corresponding first error scaling. In the present exemplary embodiment, the syndrome weight is a positive integer, thus each of the first intervals can be represented as one integer. It is assumed that the first intervals are the positive integers 0, 1, 2, . . . and so on, and the first error scalings are respectively being 1, 0.9, 0.7 . . . and so on. In the present exemplary embodiment, the error checking and correcting circuit 256 obtains the corresponding first error scaling by determining which one of the positive integers the syndrome weight is equal to. Subsequently, the error checking and correcting circuit 256 can multiply a value of each of the bits by the corresponding first error scaling to obtain the initial value. Based on whether one bit is "1" or "0", the value of such bit can be greater than 0 or less than 0, respectively. In the present exemplary embodiment, in case a specific bit is the bit "0", the value of the specific bit is greater than 0 (e.g., 1). In case the specific bit is the bit "1", the value of the specific bit is less than 0 (e.g., −1). However, the invention is not limited thereto.

Take the bit $V_0$ as an example, it is assumed that the bit $V_0$ is the bit "0", and the value of the bit $V_0$ is 1. In case the syndrome weight of the bit $V_0$ is 0, the corresponding first error scaling is 1, such that the initial value of the bit $V_0$ is 1×1=1. When the syndrome weight of the bit $V_0$ is 1, the initial value of the bit $V_0$ is 1×0.9=0.9; and when the syndrome weight of the bit $V_0$ is 2, the initial value of the bit $V_0$ is 1×0.7=0.7. Otherwise, in case the bit $V_0$ is the bit "1", the initial value of the bit $V_0$ can possibly be −1, −0.9, −0.7 and so on. Above steps of setting the first intervals and the first error scalings, determining the first intervals in which the syndrome weight is located, and obtaining the first initial value according to the first error scaling, are collectively referred to as a first procedure.

In an exemplary embodiment, the syndrome weights being generated are floating point numbers, and the mentioned first intervals may be 0 to 0.5, 0.5 to 2.5, 2.5 to 3.5 and so on. Whether the syndrome weight being an integer, a range of the first interval and a magnitude of the first error scaling are not particularly limited in the invention.

In case the magnitude in one first interval gets greater, it indicates that the syndrome weight in such first interval gets greater, and also indicates that the possibility for error to occur in the corresponding bit gets higher. Accordingly, the error checking and correcting circuit 256 may set the corresponding first error scaling to be smaller if the magnitude in the first intervals gets greater. When the error scaling is smaller, an absolute value of the first initial value being calculated is also smaller. In the first iteration decoding, the absolute value of the first initial value is served as a reliability of whether the bit is correct, and the reliability is constantly being updated. However, persons skilled in the art should be able to understand an iteration decoding of the low density parity check algorithm, thus detailed description is omitted hereinafter.

In an exemplary embodiment, the error checking and correcting circuit 256 accumulates the syndromes $S_0$ to $S_2$ (with the normal addition instead of the modulo-2 addition) to obtain an error amount. The error checking and correcting circuit 256 uses different intervals and error scalings according to the error amount. For instance, the error checking and correcting circuit 256 determines whether the error amount matches a threshold value (e.g., greater than and equal to 2). In case the error amount matches the threshold value, the error checking and correcting circuit 256 can perform the first procedure as described above. In case the error amount does not match the threshold value, the error checking and correcting circuit 256 can set a plurality of second intervals, and set each of the second intervals to correspond to a second error scaling. The second error scalings are different from the first error scalings as described above. The error checking and correcting circuit 256 can determine the second error scalings in which the syndrome weight of each of the bits $V_0$ to $V_7$ is located to obtain the corresponding second error scaling. Subsequently, the error checking and correcting circuit 256 can multiply the value of each of the bits $V_0$ to $V_7$ by the second error scaling to obtain the first initial values of the bits $V_0$ to $V_7$, and perform the first iteration decoding according to the first initial values. For instance, the first error scalings used when the error amount being 3 are listed in the Table 1 below; and the second error scalings used when the error amount being 2 are listed in Table 2 below. In other words, the error scalings used gets smaller when the error amount is less. Herein, above steps of setting the second intervals and the second error scalings, determining the second intervals in which the syndrome weight is located, and obtaining the first initial value according to the second error scaling, are collectively referred to as a second procedure.

TABLE 1

| Error amount = 3 | |
| --- | --- |
| First interval | First error scaling |
| 0 | 1 |
| 1 | 0.9 |
| 2 | 0.7 |
| 3 | 0.5 |

TABLE 2

| Error amount = 2 | |
| --- | --- |
| Second interval | Second error scaling |
| 0 | 1 |
| 1 | 0.8 |
| 2 | 0.6 |
| 3 | 0.4 |

In an exemplary embodiment, the first interval and the second interval can also be different. For instance, the first intervals in Table 1 can be 1, 2, 3 and 4. However, the second intervals in Table 2 can be 0-1 and 2-3, and the second intervals 0-1 correspond to the same second error scaling, whereas the second intervals 2-3 correspond to the same second error scaling.

Figure 7:
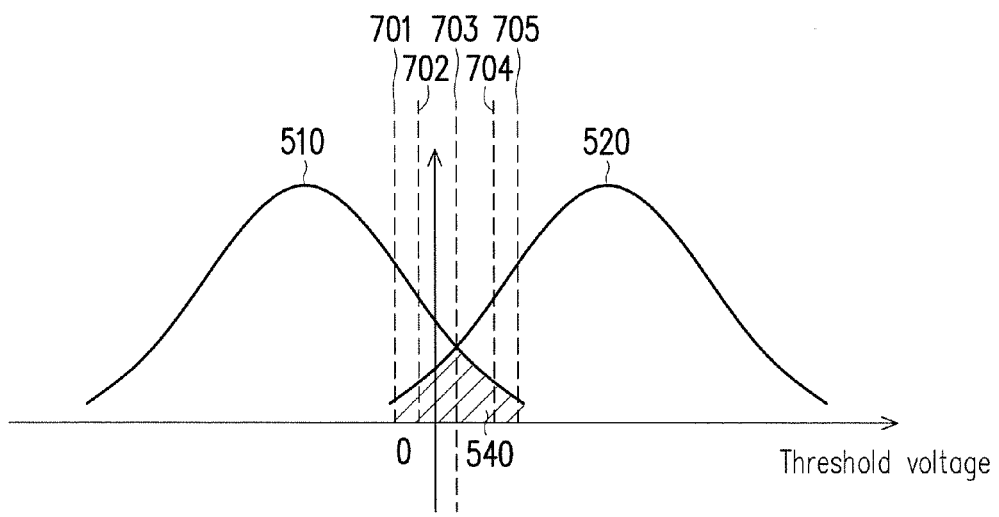
FIG. 7 is a schematic diagram illustrating an example of reading the rewritable non-volatile memory module according to a plurality of reading voltages according to an exemplary embodiment.

In an exemplary embodiment, the first iteration decoding is the hard bit mode decoding. After the first iteration decoding is performed, the error checking and correcting circuit 256 performs the parity check on a decoding result of the first iteration decoding to determine whether the decoding result has an error (also known as a second error). For instance, the decoding result includes a plurality of second bits, and the error checking and correcting circuit 256 can perform a modulo-2 matrix multiplication to the parity check matrix and the second bits to determine whether error occurs in the second bits. In case the decoding result has error, the error checking and correcting circuit 256 then performs a soft bit mode decoding. More specifically, referring to FIG. 7, FIG. 7 is a schematic diagram illustrating an example of reading the rewritable non-volatile memory module according to a plurality of reading voltages according to an exemplary embodiment. It is assumed that the said FIG. 5 illustrates the threshold voltage of the memory cell on the first physical programming unit, and FIG. 7 also illustrates the threshold voltage of the memory cell on the first physical programming unit. A difference thereof is that, in FIG. 7, the memory management circuit 202 can read the first physical programming unit according to the reading voltages 701 to 705 (also known as second reading voltages). Since a number of the reading voltages 701 to 705 is 5, each of the bits has five reading information. The reading information indicate whether bit is read as the bit "0 or the bit "1" under the corresponding reading voltages 701 to 705. The memory management circuit 202 can obtain the corresponding second initials value according to the reading information of each of the bits. For instance, the memory management circuit 202 presets a table in which the reading information and the corresponding second initial value are recorded. After the reading information is obtained, the memory management circuit 202 obtains the second initial value by looking up said table. Subsequently, the error checking and correcting circuit 256 performs a second iteration decoding of the low density parity check algorithm on the bits $V_0$ to $V_7$ according to the second initial values. In an exemplary embodiment, the second iteration decoding is also known as the said soft bit mode decoding.

Figure 8:
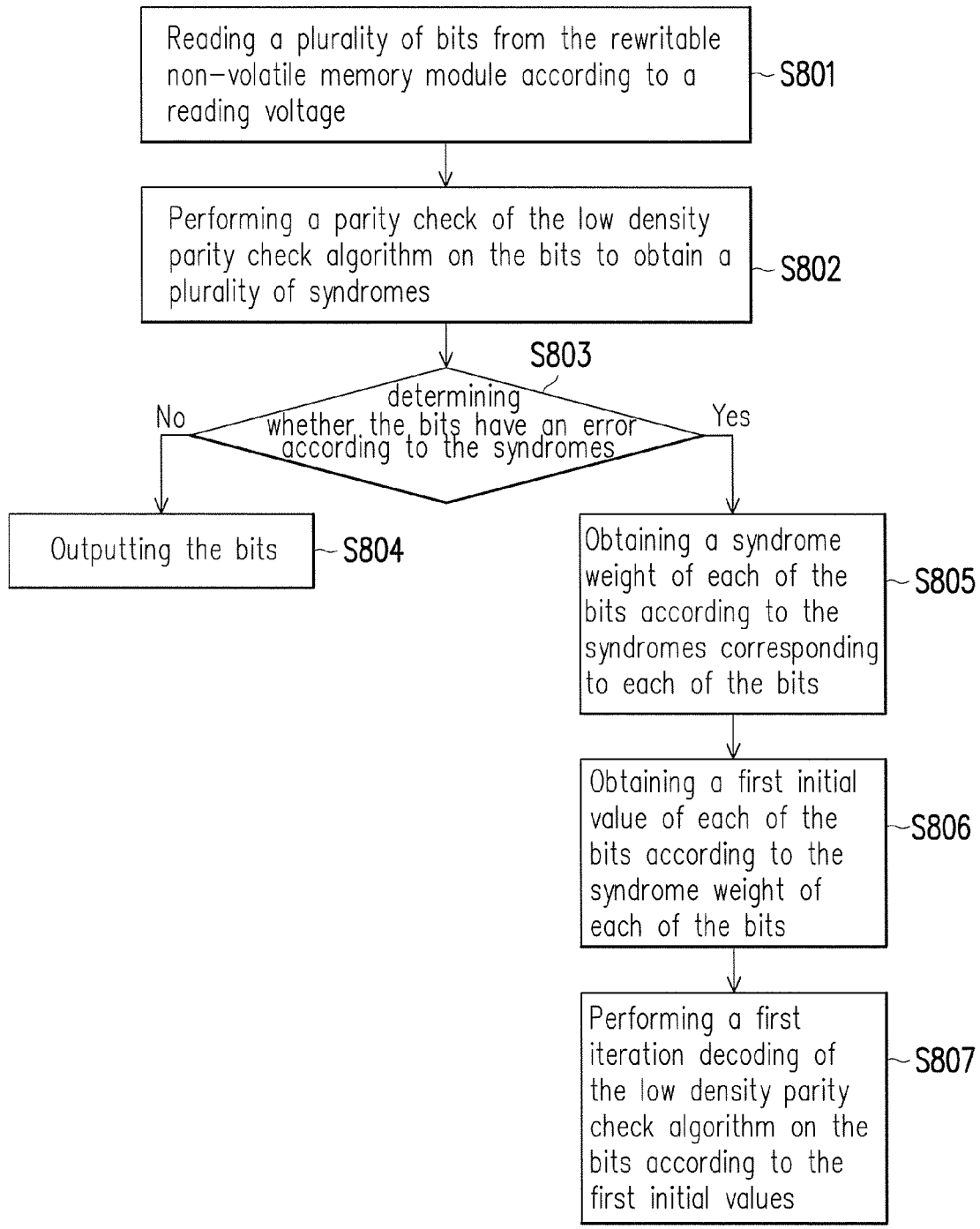
FIG. 8 is a flowchart illustrating a decoding method according to an exemplary embodiment.

FIG. 8 is a flowchart illustrating a decoding method according to an exemplary embodiment.

Referring to FIG. 8, in step S801, a plurality of bits are read from the rewritable non-volatile memory module according to a reading voltage. In step S802, a parity check of the low density parity check algorithm is performed on the bits to obtain a plurality of syndromes. In step S803, whether the bits have an error is determined according to the syndromes. If there is no error in the bits, in step S804, the bits are outputted. If the bits have an error, in step S805, a syndrome weight of each of the bits is obtained according to the syndromes corresponding to each of the bits. In step S806, a first initial value of each of the bits is obtained according to the syndrome weight of each of the bits. In step S807, a first iteration decoding of the low density parity check algorithm is performed on the bits according to the first initial values.

Nevertheless, steps depicted in FIG. 8 are described in detail as above, thus related description is omitted hereinafter. It should be noted that, the steps depicted in FIG. 8 may be implemented as a plurality of program codes or circuits. However, the invention is not limited thereto. In addition, the method disclosed in FIG. 8 can be used accompanying the foregoing exemplary embodiments, or can be used separately, and the invention is not limited thereto.

Figure 9A:
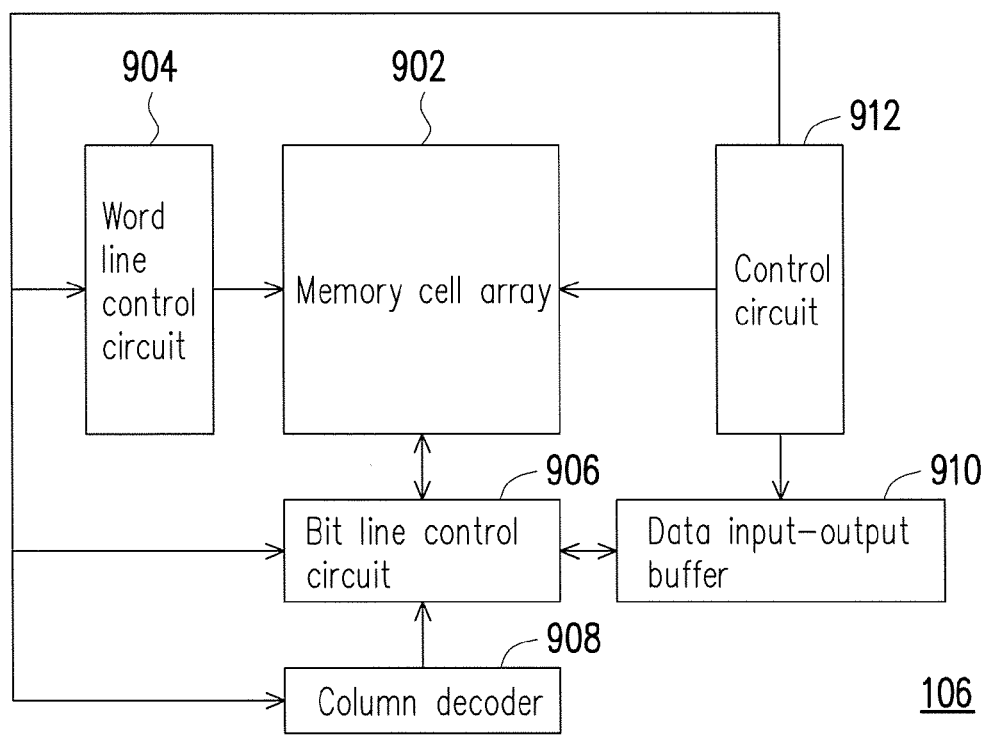
FIG. 9A is a schematic block diagram illustrating a rewritable non-volatile memory module according to an exemplary embodiment.
Figure 9B:
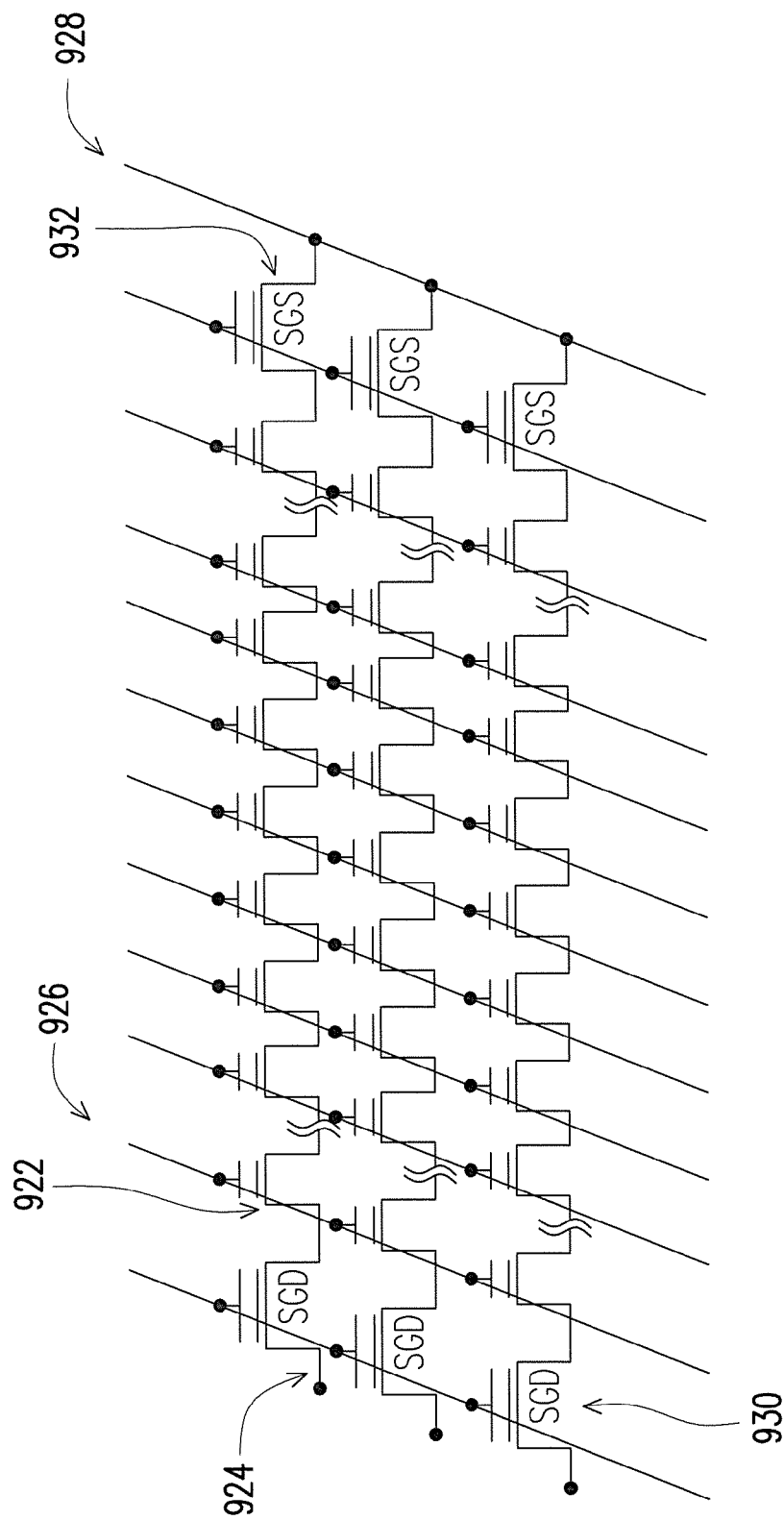
FIG. 9B is a schematic circuit diagram of a memory cell array according to an exemplary embodiment.

In an exemplary embodiment, steps depicted in FIG. 8 can also be partially performed by the rewritable non-volatile memory module 106. FIG. 9A is a schematic block diagram illustrating a rewritable non-volatile memory module according to an exemplary embodiment. FIG. 9B is a schematic circuit diagram of a memory cell array according to an exemplary embodiment.

Referring to FIG. 9A, the rewritable non-volatile memory module 106 includes a memory cell array 902, a word line control circuit 904, a bit line control circuit 906, a column decoder 908, a data input-output buffer 910 and a control circuit 912.

The memory cell array 902 includes the physical programming units as described in foregoing embodiments. More specifically, the memory cell array 902 includes a plurality of memory cells 922, a plurality of select gate drain (SGD) transistors 930, a plurality of select gate source (SGS) transistors 932, as well as a plurality of bit lines 924, a plurality of word lines 926, a common source line 928 connected to the memory cells (as shown in FIG. 9B). In the present exemplary embodiment, the memory cell 922 is disposed on an intersection of the bit line 924 and the word line 926 in a manner of matrix (in 2-dimension or 3-dimension). In case data is received from the memory control circuit unit 104, the control circuit 912 controls the word line control circuit 904, the bit line control circuit 906, the column decoder 908, the data input-output buffer 910 to write the data in the memory cell array 902 or read the data from the memory cell array 902. Therein, the word line control circuit 904 is configured to control voltages applied to the word lines 926; the bit line control circuit 906 is configured to control voltages applied to the bit lines 924; the column decoder 908 is configured to select the corresponding bit line according to a decoding row address in a command; and the data input-output buffer 910 is configured to temporarily store the data.

In an exemplary embodiment, the control circuit 912 can also be configured to perform steps S802 through S807 depicted in FIG. 8, or perform the operations of the memory control circuit unit 104 as described above. For instance, after the bits are read from the memory cell array 902 according to the reading voltage, the control circuit 912 can perform the parity check of the low density parity check algorithm on the bits to obtain a plurality of syndromes. In case the bits have error, the control circuit 912 is configured to obtain a syndrome weight of each of the bits according to the syndromes corresponding to each of the bits, obtain a first initial value of each of the bits according to the syndrome weight of each of the bit, and perform a first iteration decoding of the low density parity check algorithm on the bits according to the first initial values. Nevertheless, said steps have been described in detail as above, thus related description is omitted hereinafter.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A decoding method for a rewritable non-volatile memory module, the decoding method comprising:
    reading a plurality of bits from the rewritable non-volatile memory module according to a first reading voltage;
    performing a parity check of a low density parity check algorithm on the bits to obtain a plurality of syndromes, wherein each of the bits corresponds to at least one of the syndromes;
    determining whether the bits have at least one first error according to the syndromes;
    if the bits have the at least one first error, obtaining a syndrome weight of each of the bits according to the syndromes corresponding to each of the bits, wherein the syndrome weights comprises a first syndrome weight of a first bit among the bits and a second syndrome weight of a second bit among the bits, wherein the first syndrome weight is different from the second syndrome weight;
    obtaining a first initial value of each of the bits according to the syndrome weight of each of the bits; and
    performing a first iteration decoding of the low density parity check algorithm on the bits according to the first initial values.

2. The decoding method of claim 1, wherein the step of obtaining the syndrome weight of each of the bits according to the syndromes corresponding to each of the bits comprises:
    adding the syndromes corresponding to each of the bits to obtain the syndrome weight of each of the bits.

3. The decoding method of claim 1, wherein the step of obtaining the first initial value of each of the bits according to the syndrome weight of each of the bits comprises:
    performing a first procedure, wherein the first procedure comprises:
    setting a plurality of first intervals, and setting each of the first intervals to correspond to a first error scaling;
    determining the first intervals in which the syndrome weight of each of the bits is located to obtain the corresponding first error scaling; and
    multiplying a value of each of the bits by the corresponding first error scaling to obtain the first initial value of each of the bits.

4. The decoding method of claim 3, wherein the bits comprises a first bit,
    wherein if the first bit is a bit "0", the value of the first bit is greater than 0,
    wherein if the first bit is a bit "1", the value of the first bit is less than 0.

5. The decoding method of claim 3, wherein the step of setting the first intervals and setting the first error scalings comprises:
    setting the first error scalings to be smaller if a magnitude in the corresponding first intervals gets greater.

6. The decoding method of claim 3, wherein the step of obtaining the first initial value of each of the bits according to the syndrome weight of each of the bits further comprises:
    accumulating the syndromes to obtain an error amount;
    determining whether the error amount matches a threshold value;
    performing the first procedure if the error amount matches the threshold value;
    performing a second procedure if the error amount does not match the threshold value, wherein the second procedure comprises:
    setting a plurality of second intervals, and setting each of the second intervals to correspond to a second error scaling, wherein the second error scalings are different from the first error scalings;

determining the second intervals in which the syndrome weight of each of the bits is located to obtain the corresponding second error scaling; and multiplying the value of each of the bits by the corresponding second error scaling to obtain the first initial value of each of the bits.

7. The decoding method of claim 1, wherein the rewritable non-volatile memory module comprises a plurality of physical programming units, and the bits are read from a first physical programming unit among the physical programming units, and the decoding method further comprising:

after the first iteration decoding is performed, performing the parity check on a decoding result of the first iteration decoding to determine whether the decoding result has at least one second error;

if the decoding result has the at least one second error, performing steps including:

reading a plurality of reading information of each of the bits from the first physical programming unit according to a plurality of second reading voltage;

obtaining a second initial value of each of the bits according to the reading information of each of the bits;

performing a second iteration decoding of the low density parity check algorithm on the bits according to the second initial values.

8. The decoding method of claim 1, wherein the first initial values of at least three bits among the bits are different from each other.

9. A memory storage device, comprising:

a connection interface unit configured to couple to a host system;

a rewritable non-volatile memory module; and a memory control circuit unit coupled to the connection interface unit and the rewritable non-volatile memory module, and configured to read a plurality of bits from the rewritable non-volatile memory module according to a first reading voltage, wherein the memory control circuit unit is configured to perform a parity check of a low density parity check algorithm on the bits to obtain a plurality of syndromes, wherein each of the bits corresponds to at least one of the syndromes, wherein the memory control circuit unit is configured to determine whether the bits have at least one first error according to the syndromes, if the bits have the at least one first error, the memory control circuit unit is configured to obtain a syndrome weight of each of the bits according to the syndromes corresponding to each of the bits, wherein the syndrome weights comprises a first syndrome weight of a first bit among the bits and a second syndrome weight of a second bit among the bits, wherein the first syndrome weight is different from the second syndrome weight, wherein the memory control circuit unit is configured to obtain a first initial value of each of the bits according to the syndrome weight of each of the bits, wherein the memory control circuit unit is configured to perform a first iteration decoding of the low density parity check algorithm on the bits according to the first initial values.

10. The memory storage device of claim 9, wherein the operation that the memory control circuit unit obtains the syndrome weight of each of the bits according to the syndromes corresponding to each of the bits comprises:

the memory control circuit unit adds the syndromes corresponding to each of the bits to obtain the syndrome weight of each of the bits.

11. The memory storage device of claim 9, wherein the operation that the memory control circuit unit obtains the first initial value of each of the bits according to the syndrome weight of each of the bits comprises:

the memory control circuit unit performs a first procedure, wherein the first procedure comprises:

setting a plurality of first intervals, and setting each of the first intervals to correspond to a first error scaling;

determining the first intervals in which the syndrome weight of each of the bits is located to obtain the corresponding first error scaling; and multiplying a value of each of the bits by the corresponding first error scaling to obtain the first initial value of each of the bits.

12. The memory storage device of claim 11, wherein the bits comprises a first bit, wherein if the first bit is a bit "0", the value of the first bit is greater than 0, wherein if the first bit is a bit "1", the value of the first bit is less than 0.

13. The memory storage device of claim 11, wherein the operation that the memory control circuit unit sets the first intervals and the first error scalings comprises:

the memory control circuit unit sets the first error scalings to be smaller if a magnitude in the corresponding first intervals gets greater.

14. The memory storage device of claim 11, wherein the operation that the memory control circuit unit obtains the first initial value of each of the bits according to the syndrome weight of each of the bits further comprises:

the memory control circuit unit accumulates the syndromes to obtain an error amount;

the memory control circuit unit determines whether the en-or amount matches a threshold value;

the memory control circuit unit performs the first procedure if the error amount matches the threshold value; and the memory control circuit unit performs a second procedure if the error amount does not match the threshold value, wherein the second procedure comprises:

setting a plurality of second intervals, and setting each of the second intervals to correspond to a second error scaling, wherein the second error scalings are different from the first error scalings;

determining the second intervals in which the syndrome weight of each of the bits is located to obtain the corresponding second error scaling; and multiplying the value of each of the bits by the corresponding second error scaling to obtain the first initial value of each of the bits.

15. The memory storage device of claim 9, wherein the rewritable non-volatile memory module comprises a plurality of physical programming units, and the bits are read from a first physical programming unit among the physical programming units, wherein after the first iteration decoding is performed, the memory control circuit unit is further configured to perform the parity check on a decoding result of the first iteration decoding to determine whether the decoding result has at least one second error, if the decoding result has the at least one second error, the memory control circuit unit is further configured to perform steps including:

reading a plurality of reading information of each of the bits from the first physical programming unit according to a plurality of second reading voltage;

obtaining a second initial value of each of the bits according to the reading information of each of the bits;

performing a second iteration decoding of the low density parity check algorithm on the bits according to the second initial values.

16. The memory storage device of claim 9, wherein the first initial values of at least three bits among the bits are different from each other.

17. A rewritable non-volatile memory module, comprising:

a memory cell array; and a control circuit coupled to the memory cell array and configured to read a plurality of bits from the memory cell array according to a first reading voltage, and perform a parity check of a low density parity check algorithm on the bits to obtain a plurality of syndromes, wherein each of the bits corresponds to at least one of the syndromes, wherein the control circuit is configured to determine whether the bits have at least one first error according to the syndromes, if the bits have the at least one first error, the control circuit is configured to obtain a syndrome weight of each of the bits according to the syndromes corresponding to each of the bits, obtain a first initial value of each of the bits according to the syndrome weight of each of the bit, and perform a first iteration decoding of the low density parity check algorithm on the bits according to the first initial values, wherein the syndrome weights comprises a first syndrome weight of a first bit among the bits and a second syndrome weight of a second bit among the bits, wherein the first syndrome weight is different from the second syndrome weight.

18. The rewritable non-volatile memory module of claim 17, wherein the operation that the control circuit obtains the syndrome weight of each of the bits according to the syndromes corresponding to each of the bits comprises:

the control circuit adds the syndromes corresponding to each of the bits to obtain the syndrome weight of each of the bits.

19. The rewritable non-volatile memory module of claim 17, wherein the operation that the control circuit obtains the first initial value of each of the bits according to the syndrome weight of each of the bit comprises:

the control circuit performs a first procedure, wherein the first procedure comprises:

setting a plurality of first intervals, and setting each of the first intervals to correspond to a first error scaling;

determining the first intervals in which the syndrome weight of each of the bits is located to obtain the corresponding first error scaling; and multiplying a value of each of the bits by the corresponding first error scaling to obtain the first initial value of each of the bits.

20. The rewritable non-volatile memory module of claim 19, wherein the bits comprises a first bit, wherein if the first bit is a bit "0", the value of the first bit is greater than 0, wherein if the first bit is a bit "1", the value of the first bit is less than 0.

21. The rewritable non-volatile memory module of claim 19, wherein the operation that the control circuit sets the first intervals and the first error scalings comprises:

the control circuit sets the first error scalings to be smaller if a magnitude in the corresponding first intervals gets greater.

22. The rewritable non-volatile memory module of claim 19, wherein the operation that the control circuit obtains the first initial value of each of the bits according to the syndrome weight of each of the bit further comprises:

the control circuit accumulates the syndromes to obtain an error amount;

the control circuit determines whether the error amount matches a threshold value;

the control circuit performs the first procedure if the error amount matches the threshold value; and the control circuit performs a second procedure if the error amount does not match the threshold value, wherein the second procedure comprises:

setting a plurality of second intervals, and setting each of the second intervals to correspond to a second error scaling, wherein the second error scalings are different from the first error scalings;

determining the second intervals in which the syndrome weight of each of the bits is located to obtain the corresponding second error scaling; and multiplying the value of each of the bits by the corresponding second error scaling to obtain the first initial value of each of the bits.

23. The rewritable non-volatile memory module of claim 17, wherein the memory cell array comprises a plurality of physical programming units, and the bits are read from a first physical programming unit among the physical programming units, wherein after the first iteration decoding is performed, the control circuit is further configured to perform the parity check on a decoding result of the first iteration decoding to determine whether the decoding result has at least one second error, if the decoding result has the at least one second error, the control circuit is further configured to read a plurality of reading information of each of the bits from the first physical programming unit according to a plurality of second reading voltage, wherein the control circuit is further configured to obtain a second initial value of each of the bits according to the reading information of each of the bits, and perform a second iteration decoding of the low density parity check algorithm on the bits according to the second initial values.

24. The rewritable non-volatile memory module of claim 17, wherein the first initial values of at least three bits among the bits are different from each other.

* * * * *